(12) United States Patent
Chang et al.

(10) Patent No.: US 10,049,955 B2
(45) Date of Patent: Aug. 14, 2018

(54) FABRICATION METHOD OF WAFER LEVEL PACKAGING SEMICONDUCTOR PACKAGE WITH SANDWICH STRUCTURE OF SUPPORT PLATE ISOLATION LAYER AND BONDING LAYER

(71) Applicant: Siliconware Precision Industries Co., Ltd., Taichung (TW)

(72) Inventors: Chiang-Cheng Chang, Taichung (TW); Meng-Tsung Lee, Taichung (TW); Jung-Pang Huang, Taichung (TW); Shih-Kuang Chiu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 15/497,964

(22) Filed: Apr. 26, 2017

(65) Prior Publication Data

US 2017/0229364 A1    Aug. 10, 2017

Related U.S. Application Data

(62) Division of application No. 13/534,664, filed on Jun. 27, 2012.

(30) Foreign Application Priority Data

Mar. 3, 2012    (TW) .............................. 101107145 A

(51) Int. Cl.
*H01L 21/00*    (2006.01)
*H01L 23/31*    (2006.01)
(Continued)

(52) U.S. Cl.
CPC ........ *H01L 23/3128* (2013.01); *H01L 21/561* (2013.01); *H01L 21/568* (2013.01);
(Continued)

(58) Field of Classification Search
CPC ....... H01L 2924/00; H01L 2924/00014; H01L 2224/97; H01L 2924/181; H01L 2224/96; H01L 24/19; H01L 21/568; H01L 2924/15153; H01L 2224/04105; H01L 23/5389
(Continued)

(56) References Cited

U.S. PATENT DOCUMENTS

| 5,353,498 A | 10/1994 | Fillion et al. |
| 6,121,689 A | 9/2000 | Capote et al. |

(Continued)

*Primary Examiner* — David Chen
(74) *Attorney, Agent, or Firm* — Mintz Levin Cohn Ferris Glovsky and Popeo, P.C.; Peter F. Corless; Steven M. Jensen

(57) ABSTRACT

A fabrication method of a semiconductor package includes the steps of: forming a release layer on a carrier having concave portions; disposing chips on the release layer in the concave portions of the carrier; forming an encapsulant on the chips and the release layer; forming a bonding layer on the encapsulant; removing the release layer and the carrier so as to expose the active surfaces of the chips; and forming a circuit structure on the encapsulant and the chips. Since the release layer is only slightly adhesive to the chips and the encapsulant, the present invention avoids warpage of the overall structure during a thermal cycle caused by incompatible CTEs.

7 Claims, 5 Drawing Sheets

(51) Int. Cl.
*H01L 21/56* (2006.01)
*H01L 23/00* (2006.01)
*H01L 21/78* (2006.01)
*H01L 23/538* (2006.01)

(52) U.S. Cl.
CPC .......... *H01L 21/78* (2013.01); *H01L 23/3135* (2013.01); *H01L 24/09* (2013.01); *H01L 24/27* (2013.01); *H01L 24/29* (2013.01); *H01L 23/5389* (2013.01); *H01L 24/19* (2013.01); *H01L 2224/0401* (2013.01); *H01L 2224/12105* (2013.01); *H01L 2224/13022* (2013.01); *H01L 2224/27436* (2013.01); *H01L 2224/2919* (2013.01)

(58) Field of Classification Search
USPC ........ 438/107, 108, 110, 112, 113, 118, 124, 438/127

See application file for complete search history.

(56) References Cited

U.S. PATENT DOCUMENTS

| | | | |
|---|---|---|---|
| 6,452,265 | B1 | 9/2002 | Furukawa et al. |
| 7,202,107 | B2 | 4/2007 | Fuergut et al. |
| 7,221,055 | B2 | 5/2007 | Lange |
| 2002/0185718 | A1 | 12/2002 | Mikubo et al. |
| 2009/0160043 | A1* | 6/2009 | Shen ..................... H01L 21/568 257/690 |
| 2009/0289356 | A1* | 11/2009 | Camacho ............ H01L 21/6835 257/737 |
| 2010/0148360 | A1* | 6/2010 | Lin ..................... H01L 21/6835 257/737 |
| 2010/0159647 | A1 | 6/2010 | Ito et al. |
| 2010/0240215 | A1* | 9/2010 | Huang .................. B81C 1/0015 438/669 |
| 2011/0272800 | A1* | 11/2011 | Chino ................... H01L 21/561 257/737 |
| 2011/0316152 | A1* | 12/2011 | Miki ..................... H01L 21/561 257/737 |
| 2012/0061825 | A1* | 3/2012 | Chang .................. H01L 21/561 257/737 |
| 2012/0086117 | A1* | 4/2012 | Chang ............... H01L 23/49816 257/706 |

* cited by examiner

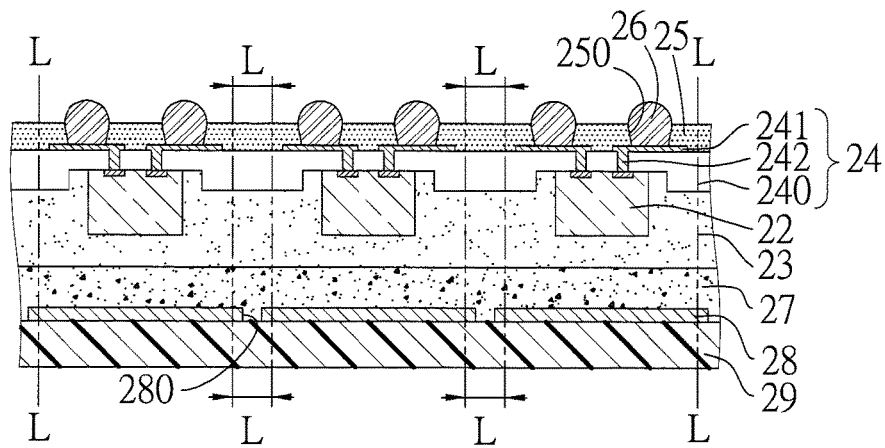
FIG. 2G
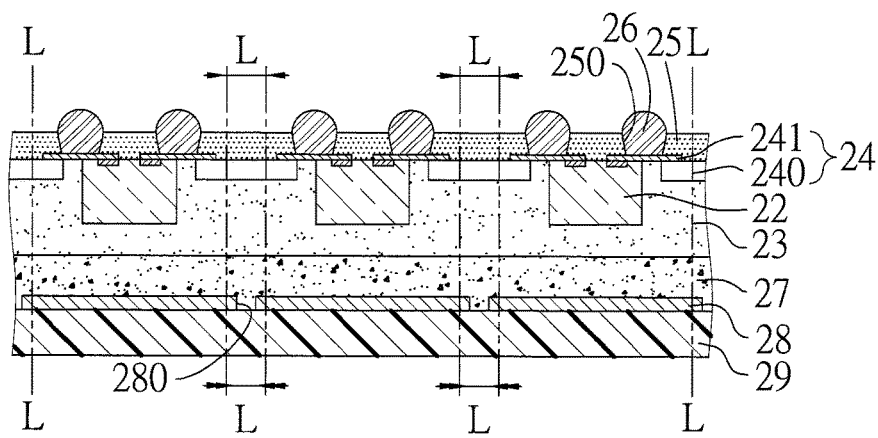
FIG. 2G'
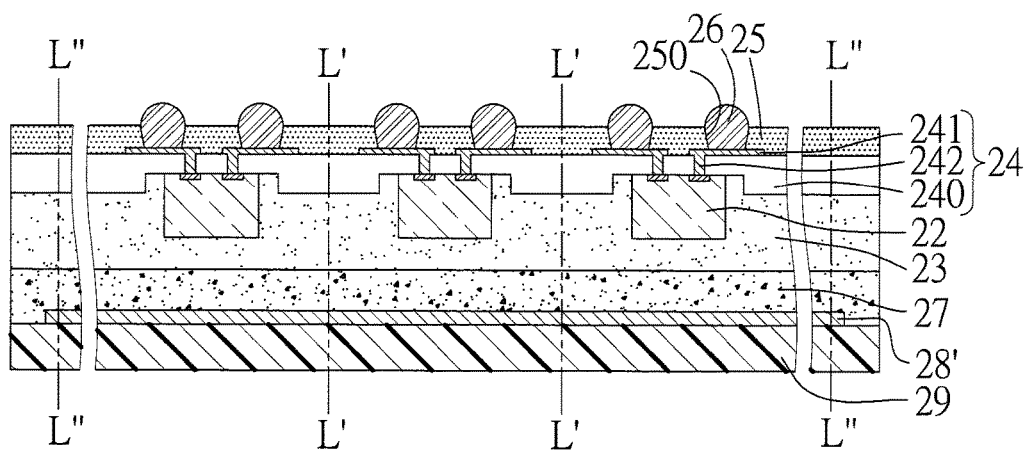
FIG. 2G"

FABRICATION METHOD OF WAFER LEVEL PACKAGING SEMICONDUCTOR PACKAGE WITH SANDWICH STRUCTURE OF SUPPORT PLATE ISOLATION LAYER AND BONDING LAYER

CROSS-REFERENCE TO RELATED APPLICATIONS

This application is a divisional of copending application U.S. Ser. No. 13/534,664, filed on Jun. 27, 2012, which claims under 35 U.S.C. § 119(a) the benefit of Taiwanese Patent Application No. 101107145, filed on Mar. 3, 2012, the entire contents of which are incorporated herein by reference.

BACKGROUND OF THE INVENTION

1. Field of the Invention

The present invention relates to semiconductor packages and fabrication methods thereof, and more particularly, to a high-reliability semiconductor package and a fabrication method thereof.

2. Description of Related Art

Along with the rapid development of electronic industries, electronic products are developed towards multi-function and high performance. To meet the miniaturization requirement of semiconductor packages, wafer level packaging (WLP) technologies have been developed.

U.S. Pat. Nos. 6,452,265 and 7,202,107 provide fabrication methods of wafer-level packages. FIGS. 1A to 1E are schematic cross-sectional views showing a fabrication method of a conventional semiconductor package 1.

Referring to FIG.1A, a thermal release adhesive layer 11 is applied on a carrier 10. The thermal release tape 11 loses its adhesive property when heated.

Referring to FIG. 1B, a plurality of chips 12 are disposed on the thermal release adhesive layer 11. Each of the chips 12 has an active surface 12a with a plurality of electrode pads 120 and an inactive surface 12b opposite to the active surface 12a, and is disposed on the thermal release adhesive layer 11 via the active surface 12a thereof.

Referring to FIG. 1C, an encapsulant 13 is formed on the chips 12 and the thermal release tape 11 through molding.

Referring to FIG. 1D, the thermal release adhesive layer 11 and the carrier 10 are removed by heating, thereby exposing the active surfaces 12a of the chips 12.

Referring to FIG. 1E, a circuit structure 14 is formed on the encapsulant 13 and the active surfaces 12a of the chips 12 and electrically connected to the electrode pads 120 of the chips 12.

However, since the thermal release adhesive layer 11 is adhesive and the difference of CTEs (Coefficient of Thermal Expansion) between the thermal release adhesive layer 11 and the carrier 10 is substantial, after the encapsulant 13 is formed, warpage can easily occur to the overall structure during a thermal cycle, thus reducing the product reliability.

Further, it is difficult to uniformly coat the thermal release adhesive layer 11 on a large-sized carrier 10. Therefore, the thermal release adhesive layer is preferably coated on a small-sized carrier 10. However, in comparison to a large-sized carrier, it is more difficult for the conveying equipment (not shown) to transport such a small-sized carrier, thereby adversely affecting the production efficiency.

Therefore, how to overcome the above-described drawbacks has become critical.

SUMMARY OF THE INVENTION

In view of the above-described drawbacks, the present invention provides a semiconductor package, which comprises: an encapsulant having a first surface formed with a protruding portion and a second surface opposite to the first surface; a chip embedded in the protruding portion of the encapsulant, wherein the chip has an active surface with a plurality of electrode pads and an inactive surface opposite to the active surface, the active surface and the electrode pads being exposed from the protruding portion of the encapsulant; a circuit structure formed on the first surface of the encapsulant and the active surface of the chip and electrically connected to the electrode pads of the chip; and a bonding layer formed on the second surface of the encapsulant.

The present invention further provides a fabrication method of a semiconductor package, which comprises the steps of: providing a carrier having a plurality of concave portions on a surface thereof and a release layer formed on the surface having the concave portions; disposing a plurality of chips on the release layer in the concave portions, respectively, wherein each of the chips has an active surface with a plurality of electrode pads and an inactive surface opposite to the active surface, the chip being disposed on the release layer via the active surface thereof; forming an encapsulant on the chips and the release layer; forming a bonding layer on the encapsulant; removing the release layer and the carrier so as to expose the active surfaces of the chips; and forming a circuit structure on the encapsulant and the active surfaces of the chips so as to electrically connect the circuit structure and the electrode pads of the chips.

In the above-described method, the carrier can be made of glass or metal, and the release layer can be made of a hydrophobic material, an inorganic material or a high polymer.

In the above-described method, the release layer can be formed through plasma-enhanced chemical vapor deposition (PECVD), and the bonding layer can be formed through lamination.

The above-described method can further comprise performing a singulation process so as to obtain a plurality of semiconductor packages.

Before removing the release layer and the carrier, the method can further comprise forming an isolation layer on the bonding layer, wherein the isolation layer is formed on a support plate so as to be sandwiched between the support plate and the bonding layer. Further, before forming the bonding layer on the encapsulant, the method can first sandwich the isolation layer between the support plate and the bonding layer. Therein, the isolation layer is not adhesive to the support plate and the bonding layer.

The isolation layer can be patterned to form gaps therein and then the isolation layer can be embedded in the bonding layer such that a portion of the bonding layer is formed in the gaps for bonding with the support plate. After forming the circuit structure, the method can further comprise cutting the overall structure along cutting paths through the gaps so as to remove the isolation layer and the support plate, thereby obtaining a plurality of semiconductor packages. Alternatively, the area of the isolation layer can be less than the area of the bonding layer and the area of the support plate such that a portion of the bonding layer encapsulates the edges of the isolation layer for the bonding layer to be bonded with the edges of the support plate. As such, after forming the circuit structure, the method can further comprise singulating the chips and cutting along the edges of the isolation layer so as to remove the support plate and the isolation layer, thereby obtaining a plurality of semiconductor packages.

In the above-described semiconductor package and method, the bonding layer can be made of polyimide (PI), a dry film or a semi-dry material.

In the above-described semiconductor package and method, the circuit structure can have at least a dielectric layer formed on the encapsulant and the active surface of the chip, a circuit layer formed on the dielectric layer and a plurality of conductive vias formed in the dielectric layer for electrically connecting the circuit layer and the electrode pads of the chip.

Further, an insulating protection layer can be formed on the outermost dielectric layer of the circuit structure and have a plurality of openings therein such that a portion of the circuit layer is exposed through the openings so as for conductive elements to be disposed thereon through the opinings.

In other embodiments, the circuit structure can have at least a dielectric layer formed on the encapsulant, and a circuit layer formed on the dielectric layer and the active surface of the chip so as to electrically connect the electrode pads of the chip.

Therefore, by providing the release layer that is only slightly adhesive to the chips and the encapsulant, the present invention avoids warpage of the overall structure during a thermal cycle caused by incompatible CTEs. Further, the release layer can be easily formed on a carrier of large size through PECVD, thereby facilitating transport and improving the production efficiency.

BRIEF DESCRIPTION OF DRAWINGS

FIGS. 2A to 2H are schematic cross-sectional views showing a fabrication method of a semiconductor package according to the present invention, wherein FIG.2E' shows another embodiment of FIG. 2E, and FIGS.2G', 2G" and 2H' show other embodiments of FIGS. 2G and 2H, respectively.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that the drawings are only for illustrative purposes and not intended to limit the present invention. Meanwhile, terms such as 'on', 'a' etc. are only used as a matter of descriptive convenience and not intended to have any other significance or provide limitations for the present invention.

FIGS. 2A to 2H are schematic cross-sectional views showing a fabrication method of a semiconductor package 2 according to the present invention.

Figure 1A:
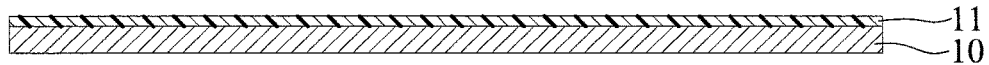
FIGS. 1A to 1E are schematic cross-sectional views showing a fabrication method of a conventional semiconductor package.
Figure 1B:
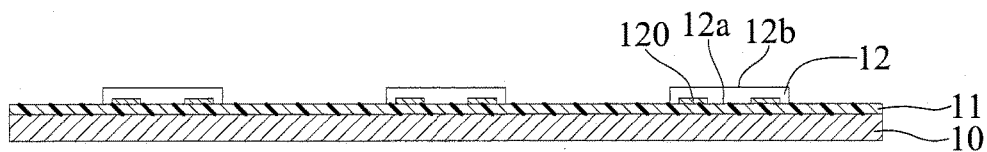
Figure 1C:
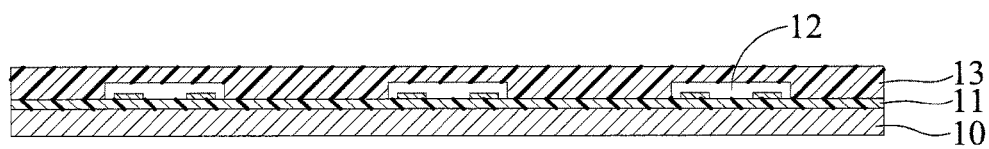
Figure 1D:
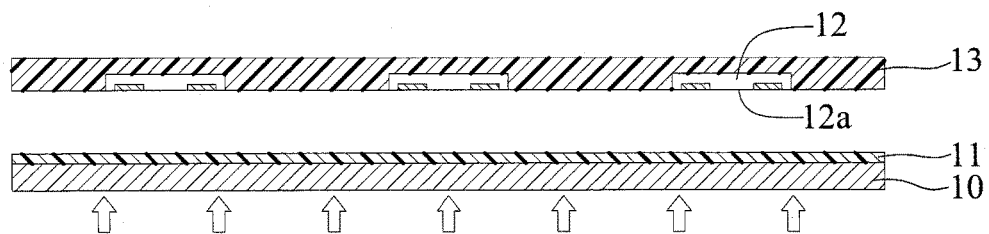
Figure 1E:
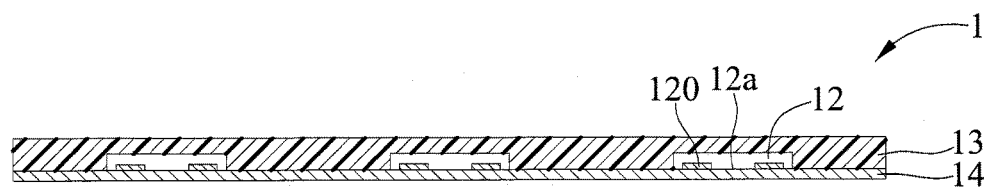
Figure 2A:
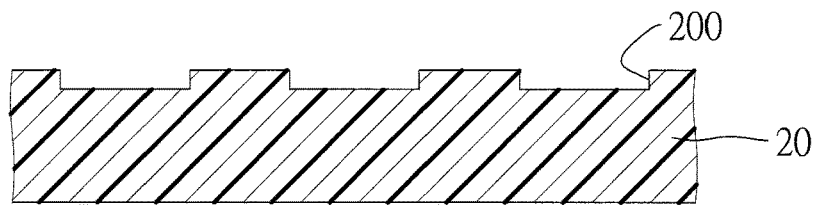

Referring to FIG. 2A, a carrier 20 having a plurality of concave portions 200 on a surface thereof is provided. In the present embodiment, the carrier 20 is made of glass or metal, and the concave portions 200 are array arranged on the carrier 20.

Figure 2B:
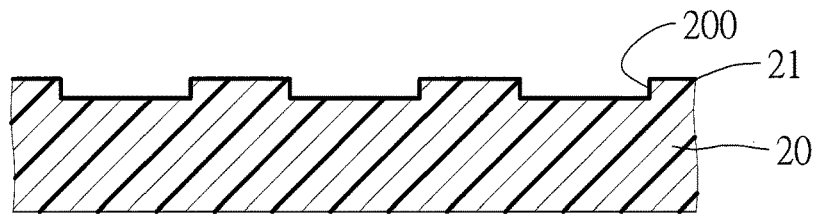

Referring to FIG. 2B, a release layer 21 is formed on the surface of the carrier 20 having the concave portions 200.

In the present embodiment, the release layer 21 is made of a hydrophobic material, an inorganic material or a high polymer such as poly-para-xylylene (parylene), and formed through plasma-enhanced chemical vapor deposition (PECVD).

Further, the release layer 21 can be easily formed on the carrier 20 of large size through PECVD, thereby facilitating transport of the carrier 20 and improving the production efficiency.

Figure 2C:
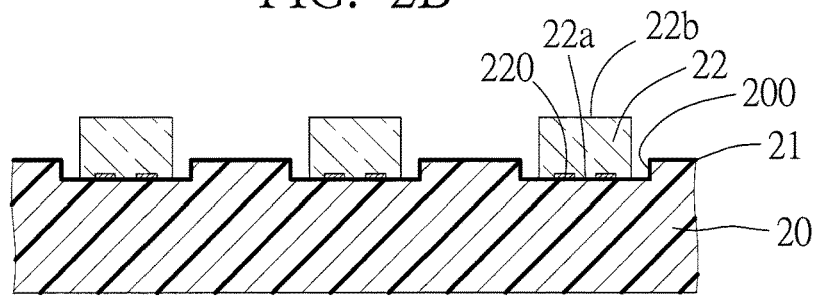

Referring to FIG. 2C, a plurality of chips 22 are disposed on the release layer 21 in the concave portions 200, respectively. Each of the chips 22 has an active surface 22a with a plurality of electrode pads 220 and an inactive surface 22b opposite to the active surface 22a, and the chip 22 is disposed on the release layer 21 via the active surface 22a thereof.

The concave portions 200 facilitate alignment of the chips 22 so as to avoid position deviation. Further, since the release layer 21 is only slightly adhesive to the chips 22 in comparison to the conventional thermal release adhesive layer, the present invention avoids significant position deviations of the chips 22 caused by the CTE of the release layer 21, thereby securing the chips 22 in position and improving the reliability of subsequent processes.

Figure 2D:
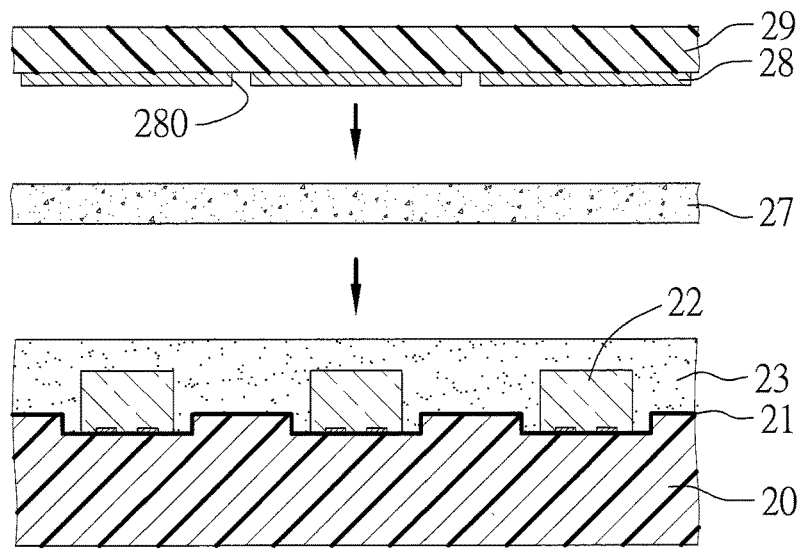

Referring to FIG. 2D, an encapsulant 23 is formed on the chips 22 and the release layer 21 by laminating or coating so as to encapsulate the chips 22.

In the present embodiment, the encapsulant 23 can be made of, but not limited to, polyimide (PI). The release layer 21 is slightly adhesive to the encapsulant 23.

Figure 2E:
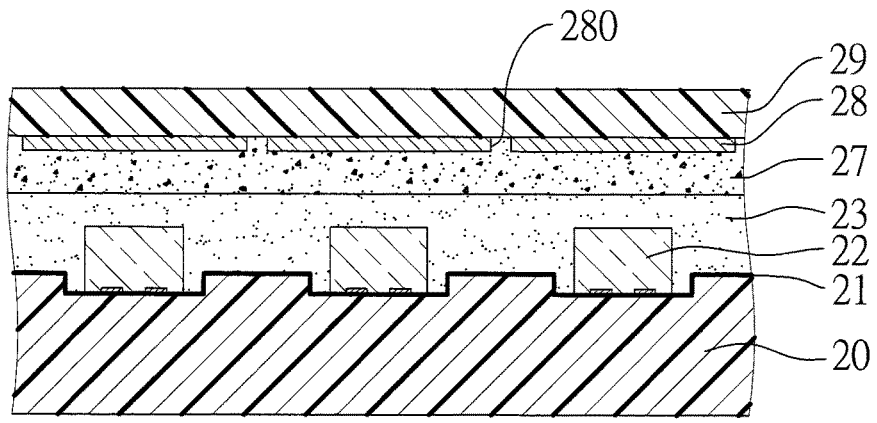
Figure 2E:
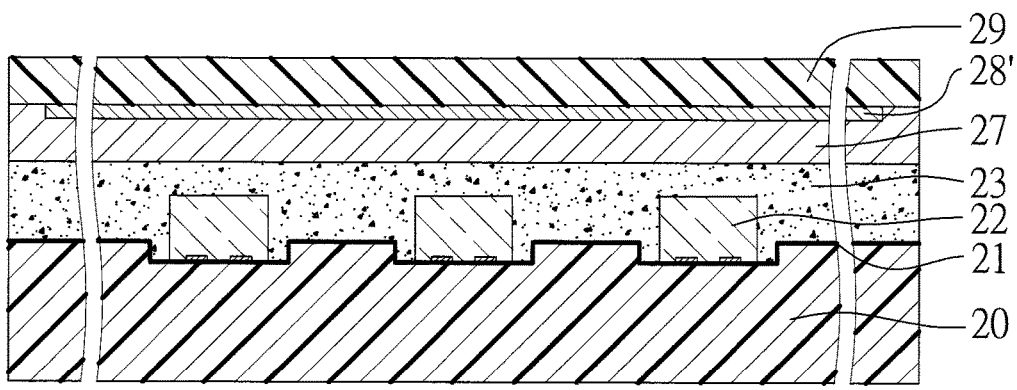

Referring to FIGS. 2D and 2E, a bonding layer 27 is laminated on the encapsulant 23 through a support plate 29, and an isolation layer 28 is laminated in the bonding layer 27.

In the present embodiment, the bonding layer 27 has a thickness of 10 to 100 um. The bonding layer 27 can be made of polyimide (PI), a dry film or a semi-dry material. The support plate 29 can be made of glass.

Further, the isolation layer 28 is neither adhesive to the bonding layer 27 (such as PI) nor adhesive to the support plate 29 (such as glass), and the bonding layer 27 (such as PI) is adhesive to the support plate 29 (such as glass). Therefore, in the fabrication process, the isolation layer 28 is first patterned to form gaps 280 therein and then laminated such that the bonding layer 27 is pressed into the gaps 280 for bonding with the support plate 29.

Referring to FIG. 2D, in the present embodiment, the bonding layer 27, the isolation layer 28 and the support plate 29 are laminated simultaneously. In other embodiment, the bonding layer 27 can be formed on the encapsulant 23 first and then the isolation layer 28 is pressed into the bonding layer 27 through the support plate 29.

In another embodiment, referring to FIG. 2E', the isolation layer 28' can have an area less than the area of the bonding layer 27 and the area of the support plate 29. As such, during the lamination process, a portion of the bonding layer 27 is pressed to encapsulate the edges of the isolation layer 28' so as to bond the bonding layer 27 with the edges of the support plate 29.

Figure 2F:
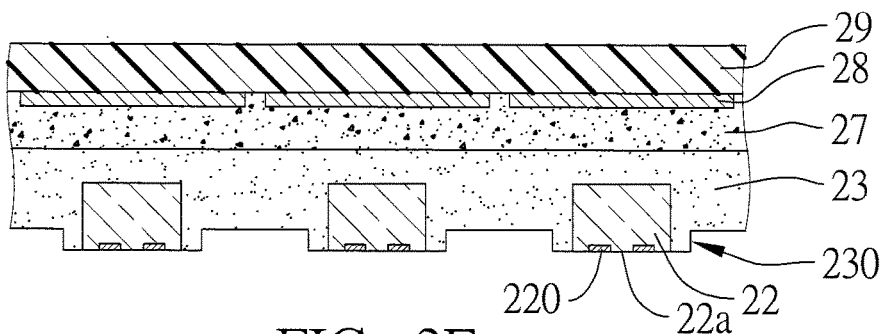

Referring to FIG. 2F, the release layer 21 and the carrier 20 are removed to expose the active surfaces 22a of the chips 22 and a plurality of protruding portions 230 of the encapsulant 23.

In the present embodiment, the carrier 20 is first removed from the release layer 21 and then the release layer 21 is removed through plasma. Since the release layer 21 is removed without the need to apply heat, the present invention avoids warpage of the overall structure during a thermal cycle.

Furthermore, the support plate 29 is provided to serve as a carrier during the removal process since the overall structure needs to be moved to another machine and turned upside down for the removal process.

Referring to FIG. 2G, a circuit structure 24 is formed on the encapsulant 23 and the active surfaces 22a of the chips 22 and electrically connected to the electrode pads 220 of the chips 22.

In the present embodiment, the circuit structure 24 has at least a dielectric layer 240 formed on the encapsulant 23 and the active surfaces 22a of the chips 22, a circuit layer 241 formed on the dielectric layer 240 and a plurality of conductive vias 242 formed in the dielectric layer 230 for electrically connecting the circuit layer 241 and the electrode pads 220 of the chips 22. Subsequently, an insulating protection layer 25 is formed on the outermost dielectric layer 240 and a plurality of openings 250 are formed in the insulating protection layer 25 such that a portion of the circuit layer 241 is exposed through the openings 250 so as for conductive elements 26 to be disposed thereon.

Therein, the number of the dielectric layers 240 can be multiple so as to increase the number of the circuit layers 241. The insulating protection layer 25 has a thickness of 30 to 500 um. The insulating protection layer 25 can be made of $SiO_2$ or silicon nitride so as to serve as a passivation layer. The insulating protection layer 25 can also be made of a reinforcing material such as polyimide (PI) and polybenzoxazole (PBO).

The conductive elements 26 can be, but not limited to, solder balls, solder bumps or solder pins.

In another embodiment, referring to FIG. 2G', the circuit structure 24 can have at least a dielectric layer 240 formed on the encapsulant 23, and a circuit layer 241 formed on the dielectric layer 240 and the active surfaces 22a of the chips 22 for electrically connecting the electrode pads 220 of the chips 22.

The present invention forms the encapsulant 23 to encapsulate the chips 22 through laminating or coating instead of molding and then forms the circuit structure 24 of large size through patterning, thus effectively reducing the fabrication cost.

Figure 2H:
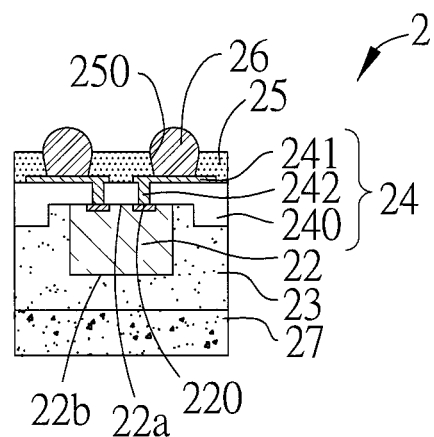
Figure 2H:
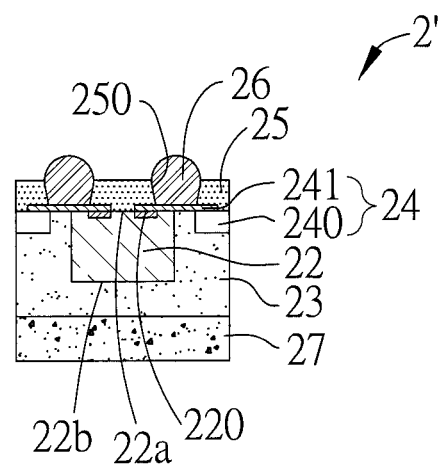

Referring to FIGS. 2H and 2H', a laser cutting tool or saw blade is used to perform a singulation process along cutting lines L (as shown in FIG. 2G) through the gaps 280 so as to obtain a plurality of semiconductor packages 2, 2'.

In the present embodiment, by cutting through the gaps 280 in the isolation layer 28, the bonding between the bonding layer 27 and the support plate 29 is eliminated. As such, the support plate 29 together with the isolation layer 28 can be removed. Therefore, the sandwich structure consisting of the support plate 29, the isolation layer 28 and the bonding layer 27 facilitates to obtain the semiconductor packages 2 after the cutting process.

In another embodiment, continued from FIG. 2E', a singulation process is performed along cutting lines L' (as shown in FIG. 2G") around the chips 22 and further along cutting lines L" (as shown in FIG. 2G") at the edges of the isolation layer 28' so as to remove the support plate 29 and the isolation layer 28.

The present invention further provides a semiconductor package 2, 2', which has: an encapsulant 23 having a first surface 23a and a second surface 23b opposite to the first surface 23a; a chip 22 embedded in the encapsulant 23; a circuit structure 24 formed on the encapsulant 23; and a bonding layer 27 formed on the second surface 23b of the encapsulant 23.

The first surface 23a of the encapsulant 23 has a protruding portion 230.

The chip 22 is embedded in the protruding portion 230 and has an active surface 22a with a plurality of electrode pads 220 and an inactive surface 22b opposite to the active surface 22a, and the active surface 22a and the electrode pads 220 are exposed from the protruding portion 230 of the encapsulant 23.

The bonding layer 27 is made of PI, a dry film or a semi-dry film.

The circuit structure 24 is formed on the first surface 23a of the encapsulant 23 and the active surface 22a of the chip 22 and electrically connected to the electrode pads 220 of the chip 22. The circuit structure 24 has at least a dielectric layer 240 formed on the encapsulant 23 and the active surface 22a, a circuit layer 241 formed on the dielectric layer 240 and a plurality of conductive vias 242 formed in the dielectric layer 240 for electrically connecting the circuit layer 241 and the electrode pads 220 of the chip 22.

Alternatively, the circuit structure 24 has at least a dielectric layer 240 formed on the encapsulant 23 and a circuit layer 241 formed on the dielectric layer 240 and the active surface 22a of the chip 22 for electrically connecting the electrode pads 220 of the chip 22. Furthermore, an insulating protection layer 25 is formed on the outermost dielectric layer 240 of the circuit structure 24 and has a plurality of openings 250 therein such that portions of the circuit layer 241 are exposed through the openings 250 so as for conductive elements 26 to be disposed thereon. Moreover, in other embodiments, the circuit structure 24 can have multiple circuit layers.

Therefore, by providing the release layer that is only slightly adhesive to the chips and the encapsulant, the present invention avoids warpage of the overall structure, thereby effectively improving the product reliability.

Further, the release layer can be easily formed on a carrier of large size so as to facilitate transport and improve the production efficiency.

Furthermore, by forming the encapsulant through laminating or coating and then forming the circuit structure of large size through patterning, the present invention reduces the fabrication cost.

Moreover, since the isolation layer is neither adhesive to the bonding layer nor adhesive to the support plate, by cutting through the gaps in the isolation layer to eliminate the bonding between the bonding layer and the support plate, the present invention can conveniently remove the support plate and the isolation layer so as to obtain a plurality of semiconductor packages.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A fabrication method of a semiconductor package, comprising the steps of:
providing a carrier having a plurality of concave portions on a surface thereof and a release layer formed on the surface having the concave portions;
disposing a plurality of chips on the release layer in the concave portions, respectively, wherein each of the chips has an active surface with a plurality of electrode pads and an inactive surface opposite to the active surface, the chips being disposed on the release layer via the active surfaces thereof;

forming an encapsulant on the chips and the release layer;

forming a bonding layer on the encapsulant;

forming an isolation layer on the bonding layer, wherein the isolation layer is disposed on a support plate so as to be sandwiched between the support plate and the bonding layer, and wherein the isolation layer is patterned to form gaps therein and then the isolation layer is embedded in the bonding layer such that portions of the bonding layer are positioned in the gaps for bonding with the support plate;

removing the release layer and the carrier so as to expose the active surfaces of the chips;

forming a circuit structure on the encapsulant and the active surfaces of the chips so as to electrically connect the circuit structure and the electrode pads of the chips; and cutting the overall structure along cutting paths through the gaps so as to remove the isolation layer and the support plate, thereby obtaining a plurality of semiconductor packages.

2. The method of claim 1, wherein the carrier is made of glass or metal.

3. The method of claim 1, wherein the release layer is made of a hydrophobic material, an inorganic material or a high polymer.

4. The method of claim 1, wherein the release layer is formed through plasma-enhanced chemical vapor deposition (PECVD).

5. The method of claim 1, wherein the bonding layer is formed through lamination.

6. The method of claim 1, wherein the bonding layer is made of polyimide (PI), a dry film or a semi-dry material.

7. The method of claim 1, wherein the isolation layer is less in area than the bonding layer and the support plate such that the portions of the bonding layer encapsulate edges of the isolation layer for the bonding layer to be bonded with edges of the support plate.

* * * * *